United States Patent [19]

Faulkner

[11] 4,277,753
[45] Jul. 7, 1981

[54] RECTIFIER CIRCUITS

[75] Inventor: Eric A. Faulkner, Cookham, England

[73] Assignee: Brookdeal Electronics Limited, Bracknell, England

[21] Appl. No.: 47,565

[22] Filed: Jun. 11, 1979

Related U.S. Application Data

[63] Continuation-in-part of Ser. No. 849,712, Nov. 8, 1977.

[30] Foreign Application Priority Data

Nov. 16, 1976 [GB] United Kingdom ............... 47721/76

[51] Int. Cl.³ .......................... H03Q 5/00; H03K 5/00
[52] U.S. Cl. ...................................... 328/26; 328/155; 328/189; 307/261
[58] Field of Search .................... 307/261; 328/26, 32, 328/189, 171, 155, 1

[56] References Cited

U.S. PATENT DOCUMENTS

| 3,233,180 | 2/1966 | Eddy ........................ 328/94 |
| 3,571,706 | 3/1971 | Bjor ........................... 328/6 |
| 3,633,117 | 1/1972 | Reilly, Jr. ................ 328/139 |
| 4,001,697 | 1/1977 | Withers et al. ........... 328/26 |

Primary Examiner—Stanley D. Miller, Jr.
Assistant Examiner—B. P. Davis
Attorney, Agent, or Firm—Shoemaker and Mattare, Ltd.

[57] ABSTRACT

A phase-sensitive detector has its reference signal modified in a manner to ensure that the output of the rectifier is substantially insensitive to harmonic frequencies of the reference signal. To achieve this the reference signal is used to generate a low-distortion sinusoidal control signal of the same frequency as the reference signal. The control signal controls a switching signal generator to generate a switching signal for repetitively switching the signal being rectified. The switching signal has spaces of interval T1 and marks of interval T2 given by $$T1 = T_o/(1+kVp)$$

$$T2 = T_o/(1-kVp)$$

where Vp is the mean value of the control signal during the relevant interval and To and k are constants chosen so that the output of the rectifier is substantially insensitive to harmonic frequencies of the reference signal.

5 Claims, 2 Drawing Figures

RECTIFIER CIRCUITS

This application is a continuation-in-part of Ser. No. 849,712, Nov. 8, 1977.

This invention relates to phase-sensitive rectifiers.

A phase-sensitive rectifier, as it is usually understood, is a unit having two a.c. input terminals S and R and an output terminal. The signal Vs to be rectified is connected to input terminal S and a square or sinusoidal reference signal Vr is connected to input terminal R. The unit acts as a rectifier for signal components in Vs which are in phase with the reference input Vr but as normally designed it also rectifies components in Vs which are harmonically related to Vr.

It is an object of the invention to provide a phase sensitive rectifier which responds only to that component in the signal to be rectified which is in phase with the fundamental frequency component Fr of the reference signal and not to components of the signal to be rectified which are in phase with harmonics of the frequency Fr.

According to the invention a phase-sensitive rectifier includes a signal input terminal to which a signal to be rectified is applied, a reference input terminal, and a pulse generator for generating a switching signal which is modified relative to the signal applied to the reference input terminal, the input to the pulse generator being a control signal of frequency equal to the frequency of the signal applied to the reference input terminal and the pulse generator providing a switching signal having spaces of interval T1 and marks of interval T2 given by $$T1 = T0/(1 + k\overline{V}p)$$

$$T2 = T0/(1 - k\overline{V}p)$$

where $\overline{V}p$ is the mean value of the control signal during the relevant interval and To and k are constants chosen so that the output of the rectifier is substantially insensitive to harmonic frequencies of the control signal.

In carrying out the invention a waveform generator may be provided for generating a low-distortion sinusoidal waveform to act as the control signal. Such generator may comprise a triangular waveform generator and a triangular-to-sine waveform converter, for example a piecewise linear shaping circuit.

In an embodiment of the invention the triangular waveform generator comprises two half-triangle waveform generators each generating a similar waveform comprising a ramp of the same direction of slope and an average level of zero separated by equal periods at zero level, which waveforms are in antiphase with each other, and a differential amplifier fed with the said waveform.

In order that the invention may be more fully understood reference will now be made to the accompanying drawings in which.

Figure 1:
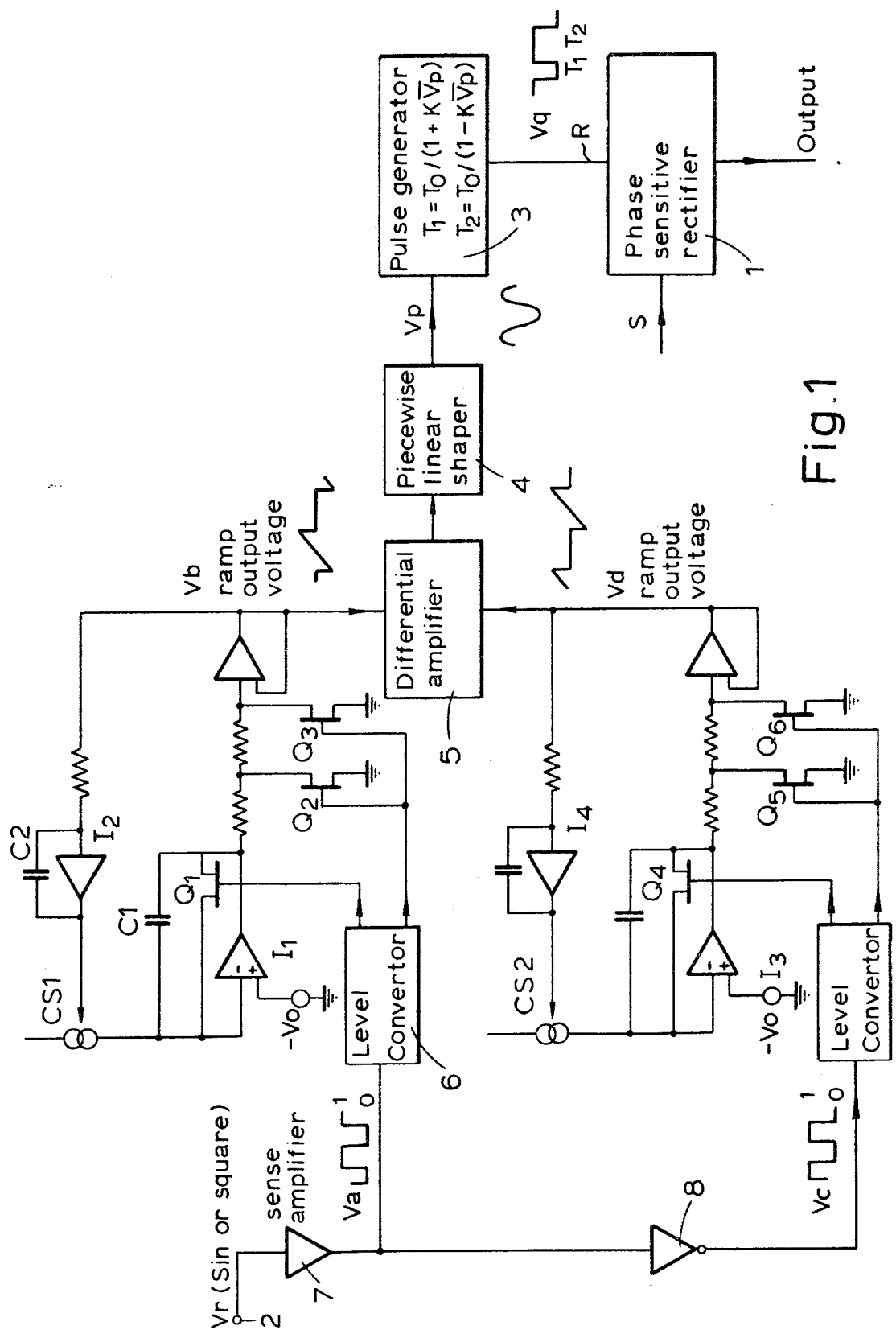
FIG. 1 is a circuit diagram of an embodiment of the invention.

FIG. 1 shows a phase-sensitive rectifier 1 having a terminal S to which a signal Vs to be rectified is applied and a terminal R to which a switching waveform is applied. The switching waveform is obtained from an input terminal 2 to which a reference voltage Vr is applied. The voltage Vr can be of square or sinusoidal waveform and has a fundamental frequency Fr. The circuits between terminal 2 and terminal R act to modify the reference waveform so that rectifier 1 does not respond to components of the signal Vs which are in phase with harmonics of frequency Fr. To this end a pulse generator 3 provides a rectangular switching waveform Vq having spaces of interval T1 and marks of interval T2 given by $$T1 = T0/(1 + k\overline{V}p)$$

and $T2 = T0/(1 - k\overline{V}p)$ where $\overline{V}p$ is the mean value of a control voltage Vp applied to pulse generator 3 during the relevant interval and T0 and k are constants.

The constant T0 gives the half-period of the waveform Vq in the absence of any control voltage Vp, in which case the mark/space ratio would be unity and Vq would be a square waveform. The constant k gives the depth of modulation and for a given control voltage Vp governs the extent to which Vp deviates from a unity mark/space ratio.

Since the switching waveform Vq is rectangular its fourier spectrum contains many frequency components including Fr and the output of the rectifier will respond to those frequency components with sensitivities which are determined by their relative strengths. The frequencies and the magnitudes of these components are determined by the values of T0 and k. The smaller the value of T0 the higher in frequency will be unwanted components lie though T0 cannot be decreased indefinitely since the accuracy of the rectifier with respect to d.c. drift will be degraded. A suitable value of T0 is usually the largest value consistent with a suitable separation in frequency between Fr and the lowest significantly large unwanted component.

The strength of the component in the waveform Vq which is due to Fr and hence the effective gain of the rectifier at this frequency increases linearly with k whilst the relative strength of the unwanted components tend to increase in a highly non-linear manner as k is increased. The value of k that is used is determined by choosing a reasonably high rectifier gain to ensure sufficient dynamic range consistent with a suitable separation in frequency between the fundamental component Fr of the reference waveform and the first significantly large unwanted response.

The control voltage Vp is derived from the reference voltage Vr and is a low-distortion sinusoidal waveform of frequency equal to Fr. Vp is generated by a piecewise linear shaping circuit 4 supplied with a triangular waveform. To ensure that Vp has low distortion it is necessary that the triangular waveform should have a well-defined frequency-independent amplitude and should be symmetrical about a line of zero voltage. To produce such a waveform the circuit of FIG. 1 generates two half-triangle waveforms Vb and Vd. These waveforms each comprise a ramp of the same direction of slope and of zero average level separated by equal periods at zero level. Vb and Vd are identical in shape but are in antiphase with each other and are switched in synchronism with the reference waveform Vr. The two half-triangle waveforms are combined in a differential amplifier 5 to produce the triangular waveform fed to the piecewise linear shaping circuit 4.

The two half-triangle generators are of similar construction to each other and considering the generator for waveform Vb it comprises an integrator I1 having a feedback capacitor C1 and supplied from a constant current source CS1 to its inverting input terminal. A static offset voltage −Vo is applied to its non-inverting input terminal. A switching transistor Q1 is connected across feedback capacitor C1 and switching transistors Q2 and Q3 are connected to earth the output from integrator I1. The switching transistors Q1, Q2 and Q3 are controlled from a level convertor 6 to which a square waveform Va is applied derived directly from the reference waveform Vr through a sense amplifier 7. The magnitude of the current supplied by constant current source CS1 is controlled from an integrating circuit I2 having a feedback capacitor C2 and fed with the half-triangle voltage Vb.

For the half-triangle waveforms Vb and Vd to produce the required triangular waveform the half-triangle waveforms need to be specified by only two parameters, these being the voltage at which successive ramps start and their shape. The latter needs to be maintained at a level consistent with the requirement for a half triangle which is symmetrical about the zero line, that is to say has a time averaged value of zero.

In order that the two half-triangle waveforms give a low distortion triangle when summed it is necessary that their edges be very fast. This can be accomplished by using the high speed switching transistors to switch the output buffer from the integrator voltage to ground at the end of each ramp. Thus very sharp edges can be obtained while allowing a whole half cycle for integrator I1 to be reset to any required value of offset voltage Vo from which successive ramps will start. Of the two parameters mentioned above the former, namely the voltage at which successive ramps start, can be implemented by the static offset voltage −Vo applied to the integrator, and only the latter, namely the slope of the ramp, needs to be controlled by a feedback loop which comprises integrator I2.

In operation of the circuit transistors Q1, Q2 and Q3 form switches which are supplied with control voltages of appropriate level derived from voltage Va through level converter 6. When Va is in its negative state then Q1, Q2 and Q3 are made non-conducting and thereby cause integrator I1 to ramp up under the control of the current source CS1 and the ramp output voltage Vb follows the integrator. When Va returns to zero Q1, Q2 and Q3 are made conducting with Q2 and Q3 forcing Vb to zero and Q1 discharging capacitor C1. The integrator is thus returned to the bias voltage −Vo, which is typically about 2 volts negative.

Thus on each downward transition of Va the output voltage Vb is returned to −Vo and then rises at a constant rate determined by the magnitude of the output current from current source CS1. When Va returns to zero Vb follows and is held at zero until the next downwards transition.

Now it is required that Vb shall have risen to exactly +Vo at the instant Va returns to zero and this is ensured by making the current supplied by CS1 dependent on the output voltage of the second integrator I2 which monitors Vb. If CS1 is supplying current at the correct rate Vb follows a half-triangle which is symmetrical about the zero line, so having a time-averaged value of zero. The output voltage of I2 thus remains constant and CS1 continues to supply current at this rate. In fact there will also be an alternating component superimposed on this output voltage which must remain negligible throughout the range of operation of the system if the distortion is to be kept minimal. If CS1 supplies current at any other rate the output voltage would be such that Vb would have a net time-averaged value. The output direct voltage level of I2 is thus incrementally shifted on each cycle until it attains the correct value.

The integrating time of I2 is chosen for a given frequency range to give low distortion and this is done by making the integrating time sufficiently large as to ensure that the alternating component of the output of I2 is small and by having a reasonably high slew rate, which is inversely proportional to the integrating time. Obviously a particular value of the integrating time allows reasonable values of alternating component and slew rate over a limited frequency range only and to overcome this it is desirable to incorporate means to switch the integrating capacitor C2 to a larger value when the output of I2 is below a certain d.c. level corresponding to when the system is operating below a particular frequency.

The circuit for generating the antiphase half-triangle voltage Vd is identical to the circuit for generating voltage Vb except that is is supplied through an invertor 8 which receives the output from sense amplifier 7 to produce a switching square waveform Vc in antiphase with switching waveform Va. The same bias voltage −Vo is applied to the corresponding integrator in this other half-triangle generator thus ensuring that the two half-triangle waveforms will have identical amplitudes to each other.

Figure 2:
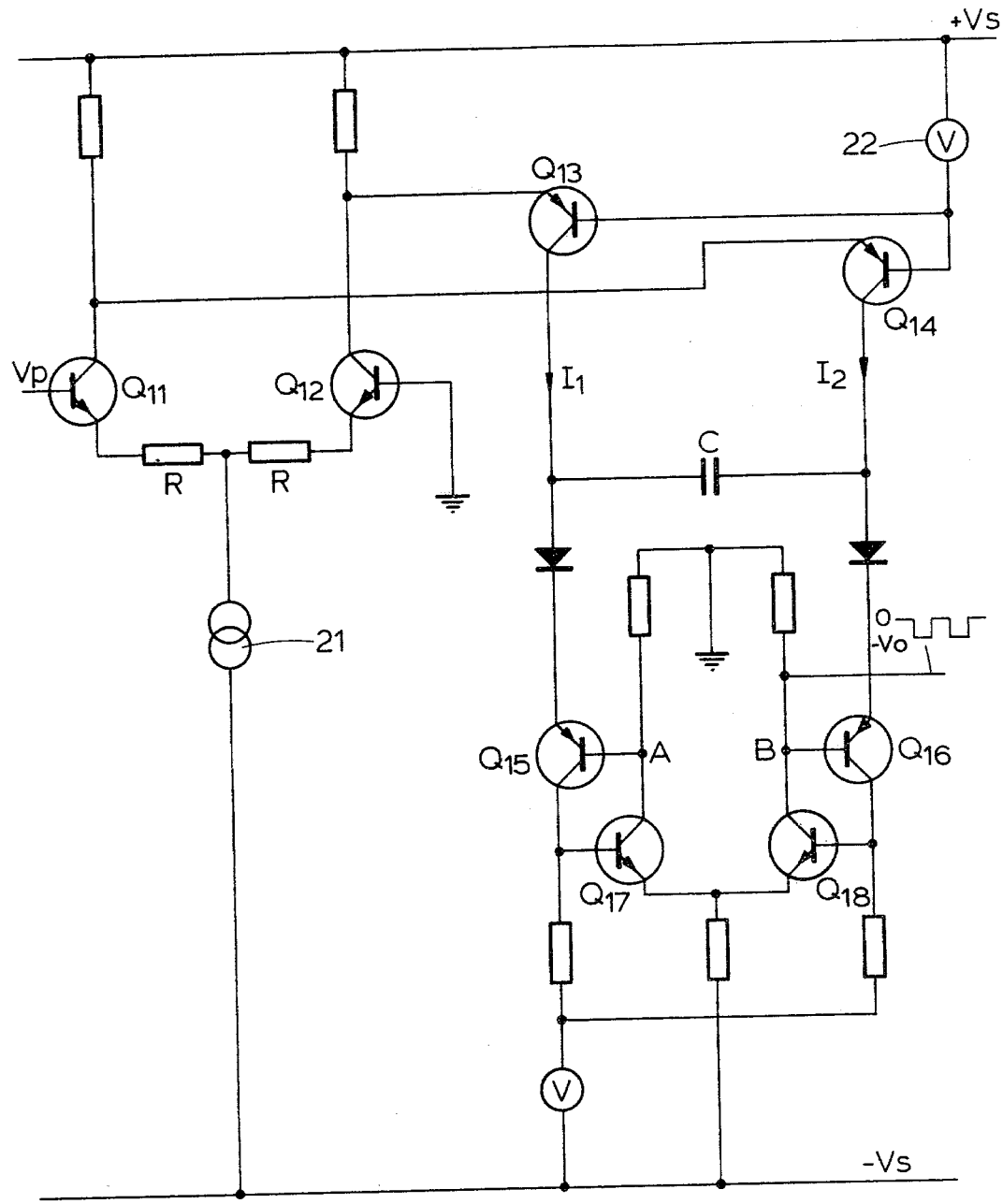
FIG. 2 illustrates in more detail the pulse generator shown in FIG. 1.

The pulse generator 3 shown in block diagrammatic form in FIG. 1 is shown in more detail in FIG. 2. Referring now to FIG. 2 the pulse generator includes a differential amplifier providing complementary current outputs and formed by four transistors Q11 to Q14. Transistors Q11 and Q12 have their emitters connected together through individual emitter resistors of value R to a constant current source 21. The input sinusoidal signal Vp is applied to the base of transistor Q11 and the base of transistor Q12 is earthed. The bases of transistors Q13 and Q14 are connected through a constant voltage element 22 to the positive supply rail +Vs. The outputs of the amplifier are taken from the collectors of transistors Q13 and Q14 and have values I1 and I2 respectively. If in the absence of any signal Vp the standing current in Q13 and Q14 are I0 then the values of I1 and I2 are given by $$I1 = I0 + Vp/2R \qquad (1)$$

$$I2 = I0 - Vp/2R \qquad (2)$$

The complementary current outputs I1 and I2 from the differential amplifier are used to determine the timing of a current-controlled oscillator formed by the transistors Q15 to Q18. The action of this oscillator may be understood by consideration of the potentials at points A and B in the oscillator. The output signal Vq is taken from point B and applied as the reference signal to phase-sensitive rectifier 1 in FIG. 1.

When Q17 is turned on and Q18 is turned off point A is at a potential of −Vo whereas point B is at zero potential, where Vo is the potential of point A as determined by the resistive path between earth and the negative supply rail −Vs when Q17 is conducting. Current I2 now flows into capacitor C until the voltage across capacitor C increases sufficiently to cause transistor Q16 to be turned on. This in turn switches the differentially connected pair of transistors Q17 and Q18 resulting in Q18 being turned on and Q17 being turned off. Point A now rises to zero potential whereas point B falls to a potential $-V_o$. Now current I1 flows into capacitor C until transistor Q5 becomes turned on thus switching the differential pair Q17 and Q18 again. By this means with capacitor C being alternately charged by I1 and I2 the oscillation is maintained and a rectangular wave output is produced at point B. The timing of the oscillator thus depends on I1 and I2 and the magnitude of capacitor C.

During each half cycle of oscillation capacitor C charges through a voltage range of $2V_o$. Therefore the marks T1 and the spaces T2 of the oscillation are given by $$T1 = 2V_oC/\bar{I}1 \quad (3)$$

$$T2 = 2V_oC/\bar{I}2 \quad (4)$$

where $\bar{I}1$ and $\bar{I}2$ are the mean values of I1 and I2 during the periods T1 and T2 respectively. Substituting equations (1) and (2) into equations (3) and (4) results in the following relationships:

$$T1 = T0/(1 + k\bar{V}p) \quad (5)$$

$$T2 = T0/(1 - k\bar{V}p) \quad (6)$$

where $T0 = 2V_oC/I_o$ and $k = 1/2RI0$.

For a peak value of Vp given by $Vp_{max}$ and if the maximum frequency of the control signal is $Fr_{max}$ then k is chosen so that $kVp_{max}$ is less than unity but as close to that value as allowed by the criterion that the output of the rectifier be substantially insensitive to harmonics of the reference frequency. T0 is chosen so that it is less than $1/5Fr_{max}$.

I claim:

1. A phase-sensitive rectifier including: a signal input terminal to which a signal to be rectified is applied; a reference input terminal to which a reference signal is applied; and means for deriving a switching signal from the reference signal for repetitively switching the signal to be rectified to obtain phase-sensitive rectification, said means comprising a control signal generator for generating a low-distortion sinusoidal control signal of frequency equal to the frequency of the reference signal, and a switching signal generator which utilizes the said control signal for generating a switching signal having spaces of interval T1 and marks of interval T2 given by $$T1 = T0/(1 + k\bar{V}p)$$

$$T2 = T0/(1 - k\bar{V}p)$$

where $\bar{V}p$ is the mean value of the control signal during the relevant interval and T0 and k are constants chosen so that the output of the rectifier is substantially insensitive to harmonic frequencies of the control signal.

2. The rectifier as claimed in claim 1 in which the said control signal generator comprises a triangular waveform generator and a triangular-to-sine waveform converter.

3. The rectifier as claimed in claim 2 in which the triangular-to-sine converter comprises a piecewise linear shaping circuit.

4. The rectifier as claimed in claim 3 in which the triangular waveform generator comprises two half-triangle waveform generators each generating a similar waveform comprising a ramp of the same direction of slope and an average level of zero separated by equal periods at zero level, which waveforms are in antiphase with each other, and a differential amplifier fed with the said waveform.

5. The rectifier as claimed in claim 4 in which each half-triangle generator comprises an integrator supplied with a static offset voltage and a constant-current source also supplying said integrator and controlled by a feedback loop from the output of the generator whereby to ensure that the slope of the ramp is such that the ramp terminates at a value equal to and of opposite sign to the said static offset voltage.

* * * * *